United States Patent [19]
Morimoto et al.

[11] Patent Number: 4,500,741
[45] Date of Patent: Feb. 19, 1985

[54] ENERGY CONVERSION ELEMENT

[75] Inventors: Kiyoshi Morimoto, Mobara; Toshinori Takagi, Nagaokakyo, both of Japan

[73] Assignee: Futaba Denshi Kogyo K.K., Mobara, Japan

[21] Appl. No.: 498,168

[22] Filed: May 25, 1983

[30] Foreign Application Priority Data

Jun. 4, 1982 [JP] Japan ................... 57-94877

[51] Int. Cl.³ ............... H01L 35/00; H01L 37/00
[52] U.S. Cl. .......................... 136/206; 136/211; 136/212; 136/225; 136/239
[58] Field of Search ........... 136/206, 211, 212, 225, 136/239

[56] References Cited

U.S. PATENT DOCUMENTS

| | | | |
|---|---|---|---|
| 3,411,956 | 11/1968 | Sibley | 136/239 X |
| 3,820,983 | 6/1974 | Starr et al. | 136/239 X |
| 3,972,740 | 8/1976 | Starr et al. | 136/239 |
| 4,106,952 | 8/1978 | Kravitz | 136/206 |
| 4,211,888 | 7/1980 | Stein et al. | 136/211 |

Primary Examiner—Leland A. Sebastian
Attorney, Agent, or Firm—Oblon, Fisher, Spivak, McClelland & Maier

[57] ABSTRACT

An energy conversion element is disclosed which is capable of efficiently converting light and thermal energies into electrical energy. The element comprises a thermoelectric material and a photoelectric material which are different in type and joined together and is capable of efficiently converting solar energy incident on the junction between the both materials into electrical energy. The thermoelectric material is most suitably formed of a transition element-silicon compound.

29 Claims, 18 Drawing Figures

Si RELATIVE TO Fe at. %

ENERGY CONVERSION ELEMENT

BACKGROUND OF THE INVENTION

1. Field of the Invention

This invention relates to an energy conversion element, and more particularly to an element for converting light and thermal energies into electrical energy.

2. Description of the Prior Art

Conventionally, a photocell utilizing a semiconductor element such as silicon, gallium arsenide or the like has been used to convert solar light energy directly into electrical energy, whereas the conversion of solar thermal energy directly into electrical energy has been carried out using a semiconductor element of the PN junction type.

However, such conventional energy conversion elements unfortunately have a disadvantage of being substantially poor in conversion efficiency. More particularly, the photocell cannot absorb light other than light of a short wavelength corresponding to band gap energy of a semiconductor used therein, resulting in the energy conversion efficiency being significantly decreased. For example, a monocrystalline silicon solar battery which is now put into practical use has an energy conversion efficiency of up to 12%. The conventional element for converting thermal energy into electrical energy has an energy conversion efficiency of 3-4% based on its theoretical value, thus, it cannot be substantially put into practical use except for the purpose of thermometry.

BRIEF SUMMARY OF THE INVENTION

The present invention has been made in view of the foregoing disadvantage of the prior art while taking notice of the fact that when solar energy is incident on the junction between a thermoelectric material having a thermoelectric effect and a photoelectric material having a photoelectric effect which are different in type and joined together, a long wavelength component of solar energy is converted into heat to allow the thermoelectric material to have a temperature gradient; so that a donor ion or an acceptor ion generated due to the flow of a carrier corresponding to such temperature gradient acts as an attracting potential field with respect to electrons or positive holes generated in the photoelectric material due to a short wavelength component of solar energy.

In other words, the present invention is based on not a concept of simply adding electricity generated from heat and light but a concept that electrons or positive holes generated in the photoelectric material due to the absorption of light energy are accelerated in a high electrical field which is formed by a donor ion or an acceptor ion generated in the thermoelectric material by heat energy, to thereby greatly increase an energy conversion efficiency.

Accordingly, it is an object of the present invention to provide an energy conversion element which is capable of greatly increasing an energy conversion efficiency.

It is another object of the present invention to provide an energy conversion element which is proof against a high temperature, and has a large thermoelectromotive force (Seebeck coefficient) and a large electrical conductivity.

In accordance with the present invention, there is provided an energy conversion element comprising a thermoelectric material having a thermoelectric effect and a photoelectric material having a photoelectric effect which are different in kind and joined together, wherein a positively ionized donor or a negatively ionized acceptor generated due to the flow of a carrier corresponding to a temperature gradient across the thermoelectric material forms an acceleration electrical field with respect to electrons or positive holes generated in the photoelectric material at the junction between the both different materials. In a preferred embodiment, the thermoelectric material is formed of a transition element-silicon compound.

BRIEF DESCRIPTION OF THE DRAWINGS

Other objects and many of the attendant advantages of the present invention will be readily appreciated as the same becomes better understood by reference to the following detailed description when considered in connection with the accompanying drawings, in which like reference numerals designate the same or similar parts throughout the figures thereof and wherein.

DETAILED DESCRIPTION OF THE PREFERRED EMBODIMENTS

Figure 1:
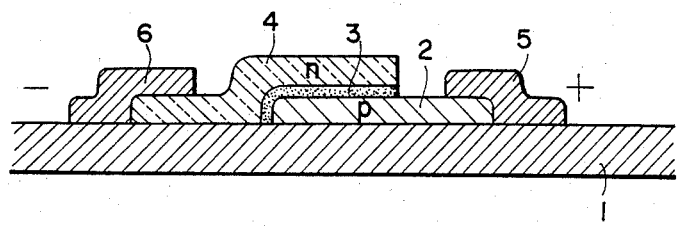
FIG. 1 is a vertical sectional view illustrating a first embodiment of an energy conversion element according to the present invention.
Figure 2:
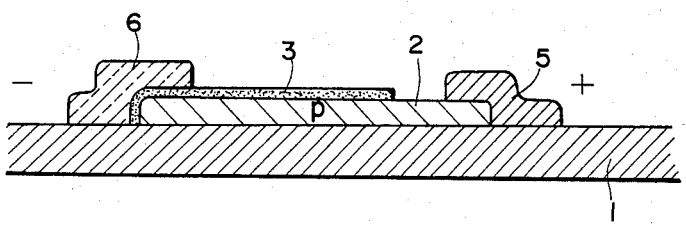
FIG. 2 is a vertical sectional view illustrating a second embodiment of an energy conversion element according to the present invention.

FIGS. 1 and 2 are sectional views illustrating first and second embodiments of an energy conversion element according to the present invention, respectively.

The energy conversion element of the first embodiment shown in FIG. 1 includes an insulating substrate 1, which is made of an inorganic material such as glass, ceramic or the like, or an organic material such as a polymer material or the like. The substrate 1 has a p-type thermoelectric material 2 deposited thereon. The p-type thermoelectric material 2 may be ZnSb or an amorphous film of a transition element-silicon compound developed by the inventors, or the like. The energy conversion element also includes a photoelectric material film 3 having a photoelectric effect and an n-type thermoelectric material film 4 which are formed in turn in a laminated relationship on the thermoelectric material 2. The photoelectric material film 3 may be formed of a-Si:H, Si, CdS, GaAs or the like, and the n-type thermoelectric material 4 may be PbTe, SbSe or an amorphous film of a light-permeable n-type transition element-silicon compound developed by the inventor, or the like. Further, the energy conversion element of the present embodiment includes output terminals or electrodes 5 and 6 made of a metallic material which are deposited on the end portions of the p-type and n-type thermoelectric materials 2 and 4, respectively. In the first embodiment constructed in such manner, the junction between two different materials is formed at two places, more particularly, between the p-type thermoelectric material 2 and the photoelectric material 3 and between the photoelectric material 3 and the n-type thermoelectric material 4.

The energy conversion element of the second embodiment shown in FIG. 2 includes a p-type thermoelectric material 2 and a photoelectric material 3 deposited in a laminated relationship on a substrate 1 and an output terminal 5 deposited on the end portion of the thermoelectric material 2, as in the first embodiment. The second embodiment also includes an output terminal 6 electrically connected directly with the photoelectric material 3 in a manner different from the first embodiment. Thus, it will be noted that the junction between two different materials is formed at only one place or between the p-type thermoelectric material 2 and the photoelectric material 3. In the second embodiment, a p-type thermoelectric material is used as the thermoelectric material 3. However, it is a matter of course that an n-type thermoelectric material may be used. The n-type thermoelectric material can exhibit the substantially same function as the p-type one, except that the former flows a current in an opposite direction to the latter.

Figure 3:
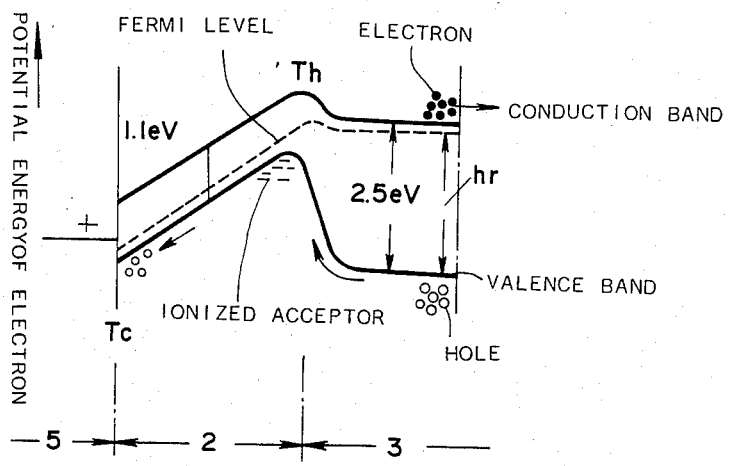
FIG. 3 is a diagrammatic view showing a potential energy of an energy conversion element according to the present invention.

Now, the mechanism of operation of the energy conversion elements according to the first and second embodiments will be described with reference to FIG. 3 and on the assumption that solar energy containing a light energy and a thermal energy is incident on the junction. FIG. 3 is a diagrammatic view showing a potential energy of each energy conversion element or the mechanism of operation of the element between the photoelectric material 3 and the p-type thermoelectric material 2.

When solar energy is incident on the junction, a long wavelength component of solar energy is converted into heat to cause the p-type thermoelectric material 2 to have a temperature gradient generated thereacross, so that positive holes formed in the p-type thermoelectric material 2 dispersedly flow to its low temperature area indicated by reference character Tc in FIG. 3 and are accumulated there to form a positive space-charge region. This allows a negatively ionized acceptor to be generated in a high temperature area Th of the p-type thermoelectric material 2 joined to the photoelectric material 3. The so-formed acceptor level acts as an attracting potential field with respect to the positive holes to generate an electrostatic force which serves to attract any of the positive holes to return to the original equilibrium state.

Whereas, a short wavelength component of solar energy having an energy $h\nu$ over an energy gap of the photoelectric material 3 is absorbed by the photoelectric material 3. The absorption of such energy by the material 3, as shown in FIG. 3, allows electrons in a valence band of the photoelectric material 3 to jump up to a conduction band thereof, to thereby respectively generate electrons and positive holes in the conduction band and valence band.

The positive holes generated in the valence band of the photoelectric material 3 are forcedly attracted by the negatively ionized acceptor of the p-type thermoelectric material 2. The attracted positive holes are then transferred to the low temperature area of the p-type thermoelectric material 2 by thermal energy.

Thus, it will be noted that the energy conversion element allows the positive holes of a high concentration generated due to both of thermal energy and light energy to be collected at the electrode or output terminal 5 arranged at the low temperature area of the p-type thermoelectric material 2.

The mechanism of operation of the energy conversion element between the photoelectric material 3 and the n-type thermoelectric material 4 in the first embodiment and that of an energy conversion element having an n-type thermoelectric material substituted for the p-type thermoelectric material 2 in the second embodiment are accomplished in substantially the same manner as described hereinbefore. More particularly, thermal energy allows electrons in the n-type thermoelectric material 4 to be dispersed therethrough to a low temperature area thereof to form a positively ionized donor level in a high temperature area thereof. Whereas, electrons generated in a conduction band of the photoelectric material 3 are attracted into a potential field of its donor to transfer to the n-type thermoelectric material 4 and then carried to a low temperature area of the n-type thermoelectric material 4, so that the electrons may be effectively collected at the output terminal or electrode 6 in the substantially same manner as in the positive holes described above. Thus, a high output voltage is obtained which is sufficient to allow the energy conversion element to have an energy conversion efficiency above 30%.

Figure 4:
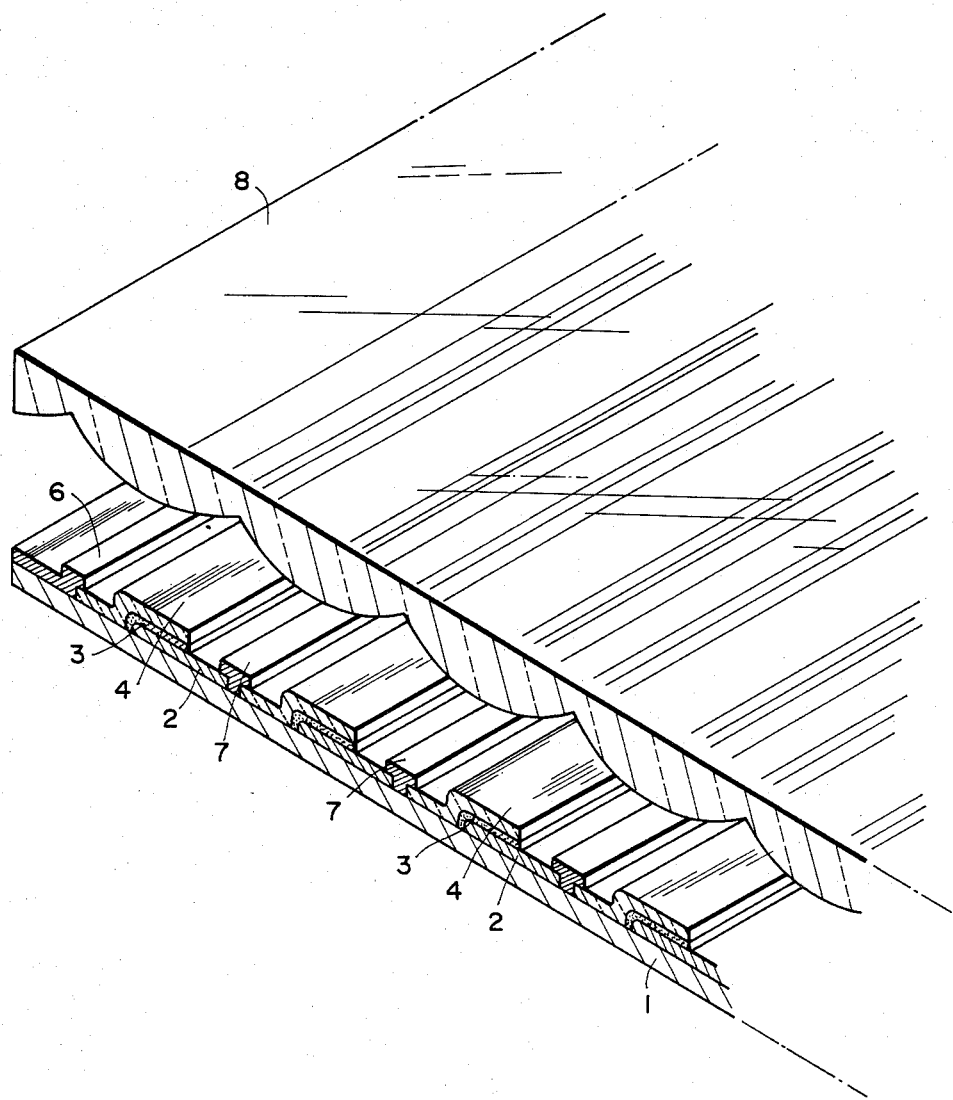
FIG. 4 is a perspective view showing a third embodiment of an energy conversion element according to the present invention.
Figure 5:
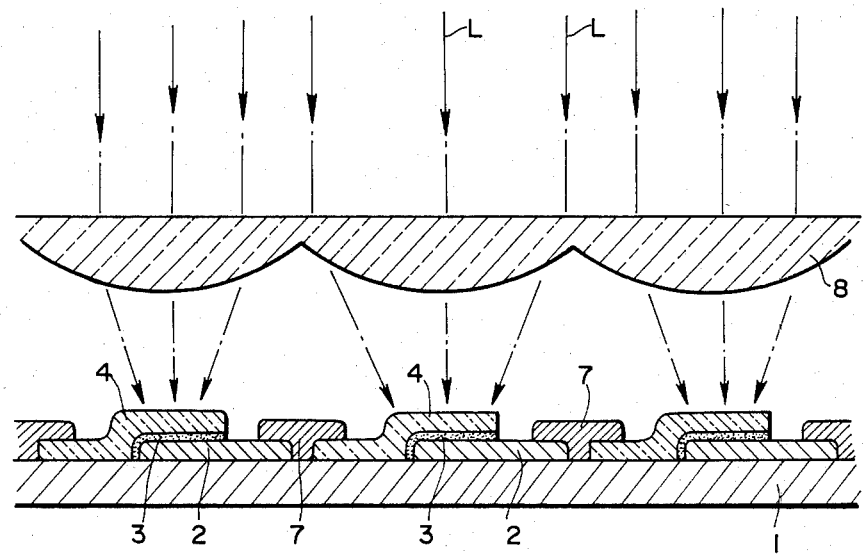
FIG. 5 is a vertical sectional view showing a third embodiment of an energy conversion element according to the present invention.

FIGS. 4 and 5 illustrate a third embodiment of an energy conversion element according to the present invention. The third embodiment is constructed in a manner to connect the individual energy conversion elements of the first embodiment in series in turn by means of connecting conductors 7 to form an integrated structure. The embodiment may include a Fresnel lens 8 arranged above the structure. In the embodiment, solar light L, as shown in FIG. 5, is effectively incident on the junction formed at the high temperature area of each element. When the lens 8 is not arranged, temperature gradients across the thermoelectric materials 2 and 4 can be generated by shielding the output terminals 5 and 6 and the connecting conductors 7 and their peripheral sections by means of a shield plate.

Figure 6:
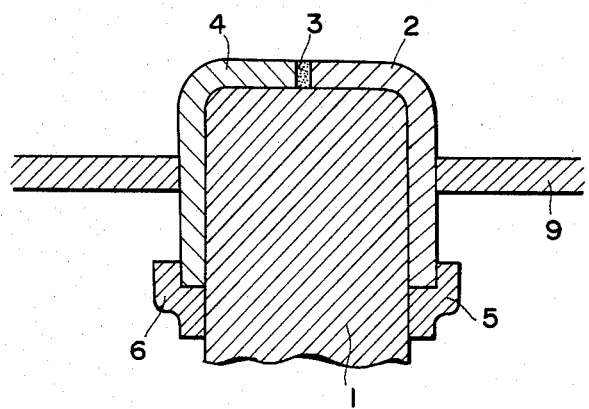
FIG. 6 is a vertical sectional view showing a fourth embodiment of an energy conversion element according to the present invention.
Figure 7:
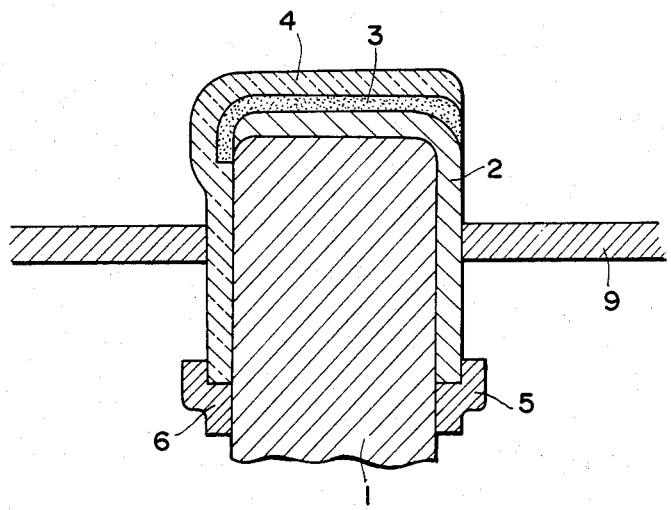
FIG. 7 is a vertical sectional view showing a fourth embodiment of an energy conversion element according to the present invention.
Figure 8:
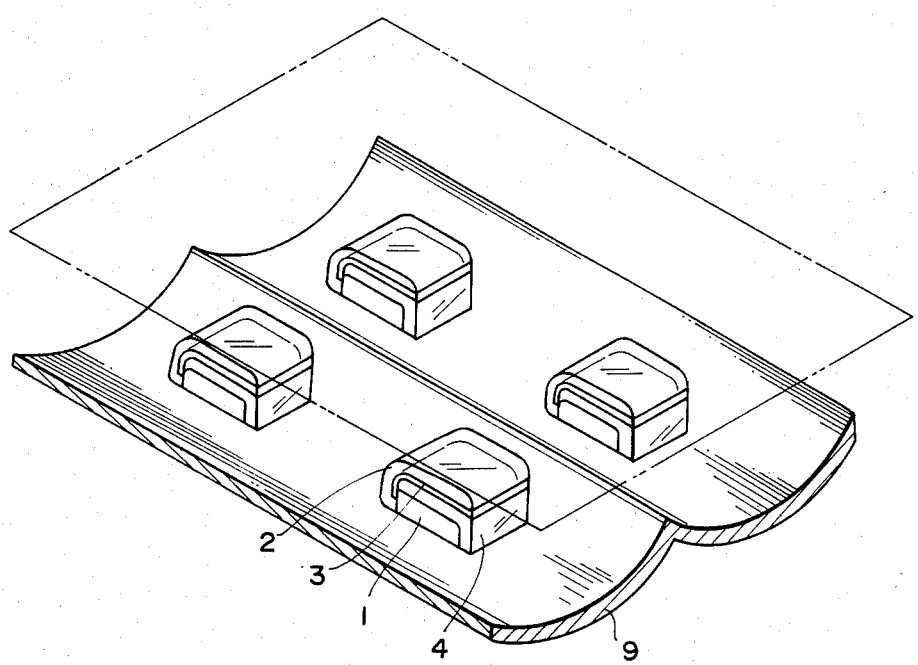
FIG. 8 is a perspective view showing a fourth embodiment of an energy conversion element according to the present invention.

FIGS. 6, 7 and 8 illustrate a fourth embodiment of an energy conversion element according to the present invention which is formed by modifying the element of the first embodiment to allow the element to bear up against a high electric power. The embodiment is constructed in a manner to reform the element of the first embodiment to permit it to have a three-dimensional structure and thermally separate the high temperature area and the low temperature area from each other by means of a reflection plate 9 also acting as a shield plate, to thereby allow the difference in temperature between the high temperature area and the low temperature area to be increased.

Figure 9:
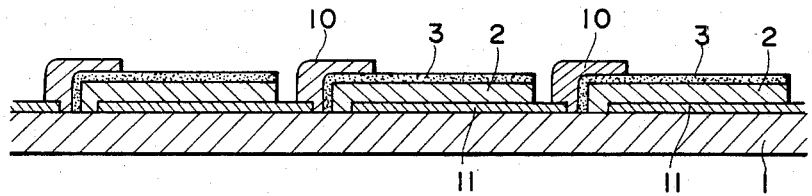
FIG. 9 is a vertical sectional view showing a fifth embodiment of an energy conversion element according to the present invention.

A fifth embodiment of an energy conversion element according to the present invention is illustrated in FIG. 9, which is in the form of an integrated structure formed by connecting the elements of the second embodiment in series in turn through first connecting conductors 10 and second connecting conductors 11 so that the second connecting conductor 11 may be arranged in the low temperature area of each element. Such construction allows the rear side of the substrate 11 to be cooled, to thereby facilitate cooling of the element.

Figure 10:
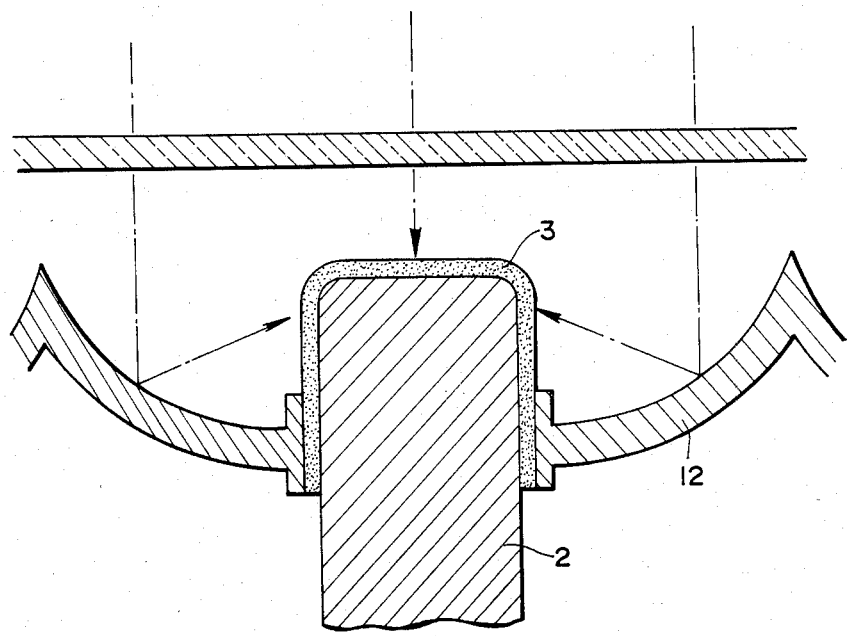
FIG. 10 is a vertical sectional view showing a sixth embodiment of an energy conversion element according to the present invention.

FIG. 10 illustrates a sixth embodiment of an energy conversion element according to the present invention which is formed by modifying the element of the second embodiment to permit it to bear up against a high electric power. The element of this embodiment is constructed by modifying the element of the second embodiment to allow it to have a three-dimensional structure and thermally separating the high temperature area and the low temperature area from each other by means of a shield plate 12 which also acts as an electrode.

The thermoelectric materials 2 and 4 used in each of the embodiments described hereinbefore are most suitably formed of an amorphous film of a transition element-silicon compound developed by the inventors.

The following description will be made in connection with such amorphous film with reference to FIGS. 11 to 18. Also, the following description will be made on an amorphous film of a Fe-Si compound which is typical of the transition element-silicon compound.

Figure 11:
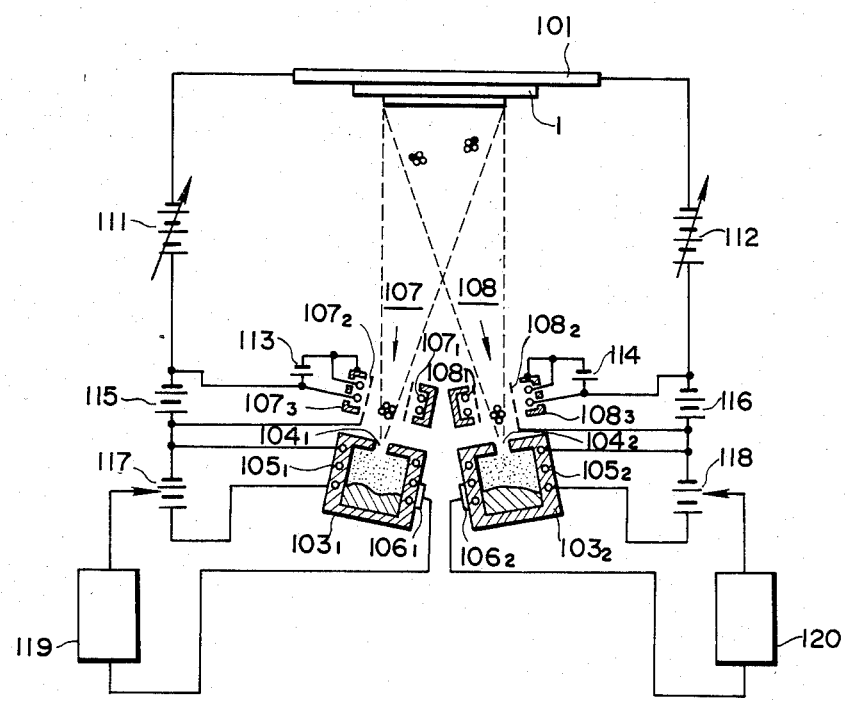
FIG. 11 is a schematic view showing one example of an apparatus used in the preparation of an amorphous film of a transition element-silicon compound suitable for use in a thermoelectric material of an energy conversion element of the present invention.

First, an amorphous film of a Fe-Si compound prepared according to a cluster ion beam deposition method (hereinafter referred to "CIBD method") using an apparatus schematically shown in FIG. 11 will be explained hereinafter. The apparatus shown in FIG. 11 is adapted to eject vapors of Fe and Si from two closed-type crucibles separate from each other to carry out the deposition on a substrate.

More particularly, the apparatus includes a holder 101 for holding a substrate 1 on which an amorphous film is to be deposited. The apparatus also includes two closed-type crucibles $103_1$ and $103_2$ disposed separate from each other, each of which has at least one injection nozzle $104_1$ ($104_2$) of a smaller diameter. The crucibles are respectively charged therein with Fe and Si which are component elements of the compound. The crucibles $103_1$ and $103_2$ respectively have heating elements $105_1$ and $105_2$ embedded in the outer wall thereof so that the crucibles may be heated by resistance heating. The crucibles $103_1$ and $103_2$ are also provided on the outer wall thereof with thermocouples $106_1$ and $106_2$ which act to measure temperatures of the crucibles, respectively.

Adjacent to the injection nozzles $104_1$ and $104_2$, ionization chambers 107 and 108 are arranged which comprise filaments $107_1$ and $108_1$ for emitting thermions therefrom, acceleration electrodes $107_2$ and $108_2$ for accelerating thermions emitted from the filaments $107_1$ and $108_1$, and shielding plates $107_3$ and $108_3$ for preventing the undesired fly of thermions, respectively.

The apparatus further includes acceleration power sources 111 and 112 of which outputs are variable from the outside as desired. The power sources 111 and 112 are adapted to keep the holder 101 at a high negative potential with respect to the ionization chambers 107 and 108 to impart kinetic energy to positively ionized particles to allow the particles to impinge on the substrate. Reference numerals 113 and 114 indicate power sources for heating the filaments $107_1$ and $108_1$ of the ionization chambers 107 and 108 to permit the filaments to emit thermions, and reference numerals 115 and 116 designate ionization power sources which act to keep the acceleration electrodes $107_2$ and $108_2$ at a high positive potential with respect to the filaments $107_1$ and $108_1$ to accelerate thermions emitted from the filaments to permit thermions to be bombarded with vaporized particles in the ionization chambers 107 and 108, so that the particles may be ionized. Furthermore, the apparatus includes power sources 117 and 118 for supplying electric current to the heating elements $105_1$ and $105_2$ to heat the crucibles $103_1$ and $103_2$, of which outputs are also variable from the outside as desired.

Reference numerals 119 and 120 indicate temperature control sections which are adapted to receive outputs of the thermocouples $106_1$ and $106_2$ provided on the crucibles $103_1$ and $103_2$ to control temperatures of the crucibles. More particularly, the temperature control sections 119 and 120 serve to compare temperatures of the crucibles $103_1$ and $103_2$ detected by the thermocouples $106_1$ and $106_2$ with preset temperatures of the sections 119 and 120 to control the outputs of the power sources 117 and 118 depending upon the differences between the both temperatures, to thereby control temperatures of the crucibles. This allows vapor pressures within the crucibles to be kept at predetermined values.

The apparatus shown in FIG. 11 is encapsulated in a vacuum casing (not shown) except the power sources 111 to 118 and the temperature control sections 119 and 120. The vacuum casing is evacuated through a suitable evacuation system to permit the apparatus to be placed in a high vacuum atmosphere of $10^{-2}$ Torr or less, preferably $10^{-4}$ Torr or less.

In this example, as materials to be charged in the crucibles $103_1$ and $103_2$, Fe and Si were used which have a high purity above 99.99%. Fe and Si charged in the crucibles were then heated to a high temperature to be vaporized therein. The vaporized materials were ejected through the injection nozzle $104_1$ and $104_2$ into the high vacuum region to form clusters and then ionized. Then, the ionized clusters were deposited on the substrate 1 formed of, for example, glass. In preparation of the Fe-Si amorphous film of the present embodiment, the crucible $103_1$ having Fe charged therein was substantially kept at a temperature of 1600° C. and the crucible $103_2$ of Si was varied within a range between 1600° C. and 2000° C., to thereby prepare amorphous films different in composition ratio. The vacuum region was kept at a pressure of $5 \times 10^{-6}$ Torr during the deposition and the substrate was kept at a temperature of 150° C. Also, only the clusters of Fe were ionized and the ionization of clusters of Si was not made during the deposition. However, the inventor's experiment proved that the ionization of both clusters of Fe and Si meets with the substantially same results as the present example. Furthermore, in the example, ionization current Ie for Fe was set at about 200 mA. Acceleration voltages Va for Fe and Si were set at zero. In other words, the clusters of Fe and Si have kinetic energy corresponding to the injection velocity from the nozzle. The acceleration voltages, as described hereinbefore, may be varied by means of the power sources 111 and 112 as desired.

A composition ratio in a film prepared under the above-mentioned conditions was calculated on the basis of its density and film thickness measured by means of a double interference microscope. It was found that the film thus formed is glossy and blue-black, and has a very flat surface. Further, an X-ray diffractometry verified that the film is completely amorphous. More particularly, any peak peculiar to a crystal structure does not appear in FIG. 18 which is an X-ray diffraction pattern of the FeSi$_2$ compound mentioned above, thus, it is proved that the compound is amorphous.

Figure 12:
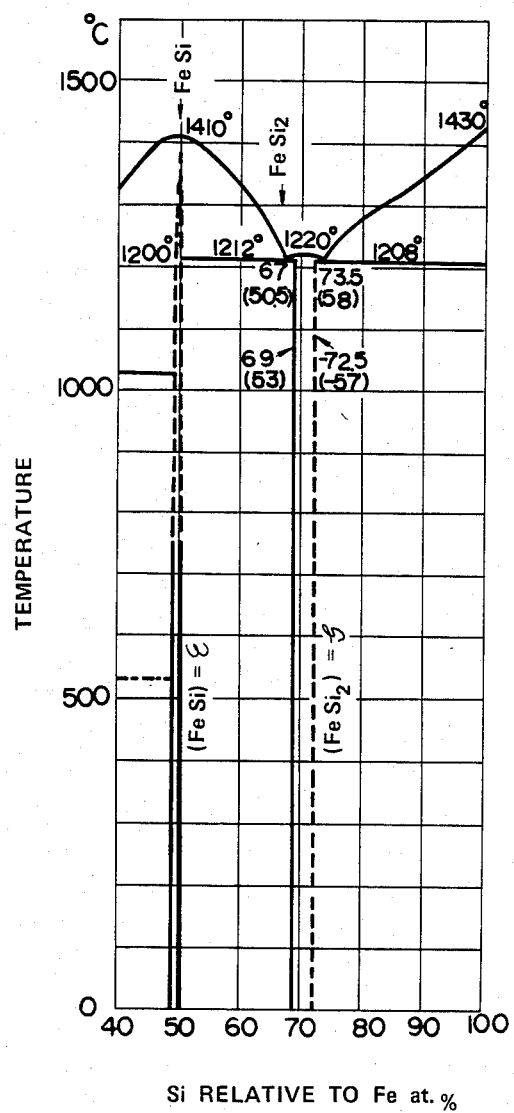
FIG. 12 shows the main part of a two-component system phase diagram of a Fe-Si compound which is typical of a transition element-silicon compound.

The main portion of a two-component phase diagram of a Fe-Si compound is shown in FIG. 12. In the example, the amorphous film was prepared taking notice of a $\zeta$-FeSi$_2$ phase (crystal structure; tetragonal system: lattice constants; a=2.692 Å, c=5.137 Å, c/a≈1.908: numbers of atom per unit cell; 3) which is capable of forming a stable solid solution when Si is present at the range between 69 at. % and 72.5 at. %, as shown in FIG. 12. Also, thermoelectric, electric and optical properties of the film were considered. For comparison, an amorphous film formed of a $\epsilon$-FeSi phase in which a composition ratio of Fe to Si is 1:1 was prepared and considered.

Figure 13:
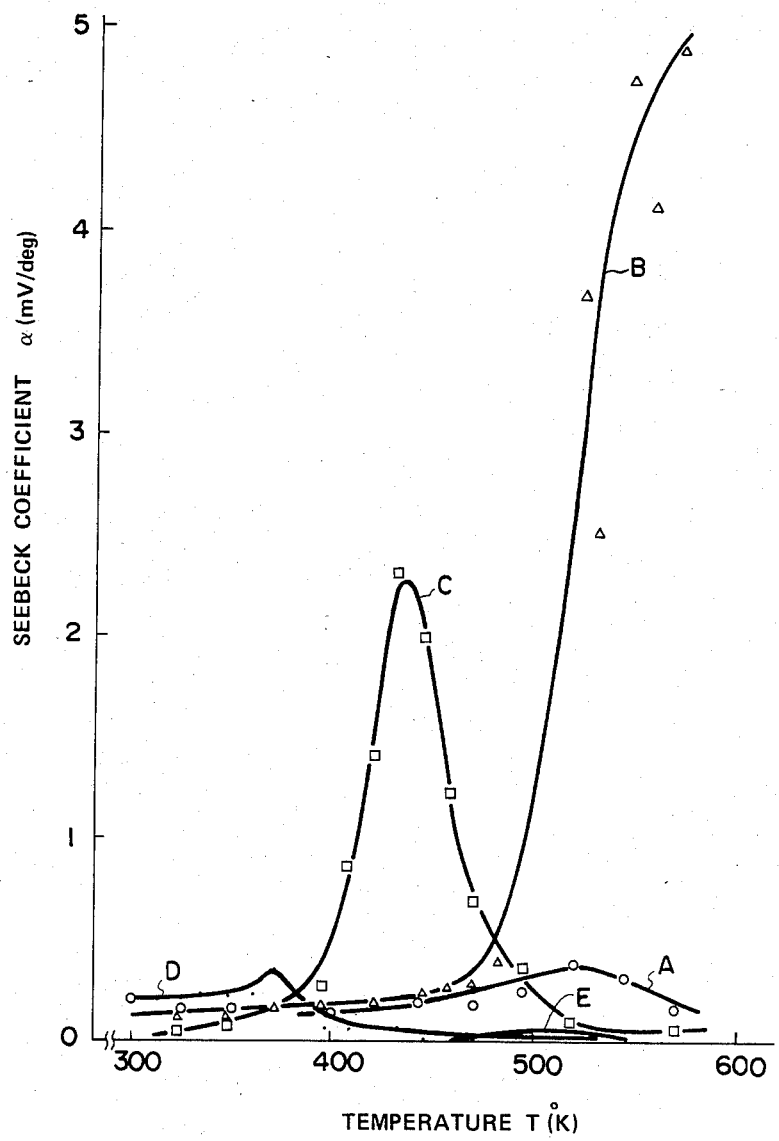
FIG. 13 is a graphical representation showing temperature characteristics of positive Seebeck coefficient of transition element-silicon amorphous film.

FIG. 13 shows measured temperature characteristics of a Seebeck coefficient (thermoelectromotive force per unit temperature) of each of the amorphous films formed of $\zeta$-FeSi$_2$ phase and $\epsilon$-FeSi phase. In FIG. 13, curves A, B, C and D relate to the amorphous films formed of $\zeta$-FeSi$_2$ phase used in the present invention wherein composition ratios of Si to Fe are 68 at. %, 72 at. %, 80 at. % and 83 at. %, respectively. Curve E indicates an amorphous film of $\epsilon$-FeSi phase in which a composition ratio of Si to Fe is 50 at. %. As can be seen from FIG. 13, the film of $\epsilon$-FeSi phase indicated by curve E has a Seebeck coefficient of about +40 $\mu$V/deg which provides the film with metallic properties, whereas the film indicated by B wherein Si of 72 at. % is contained in the solid solution region of $\zeta$-FeSi$_2$ phase has a large Seebeck coefficient of about ±15 mV/deg at a temperature of 550° K. The Seebeck coefficient gradually decreases as the content of Si exceeds a range of Si in the solid solution. That is, a Seebeck coefficient of the film having a Si content of 80 at. % is about ±2.2 mV/deg, whereas the film having a Si content of about 83 at. % has a Seebeck coefficient of about ±300 $\mu$V/deg. Further, the increase of a Si content in the film causes the maximum value of Seebeck coefficient to be transferred to a low temperature side.

Figure 14:
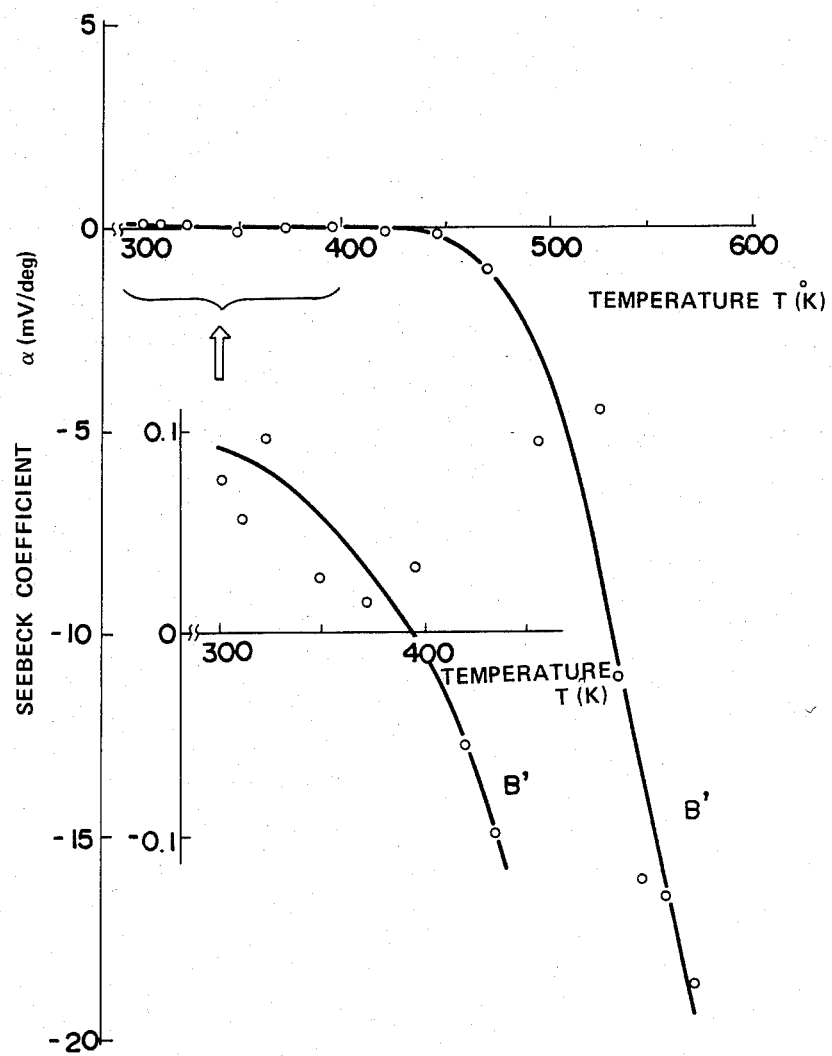
FIG. 14 is a graphical representation showing temperature characteristics of negative Seebeck coefficient of a transition element-silicon amorphous film.

The amorphous films of the example formed of $\zeta$-FeSi$_2$, as apparent from the results shown in FIG. 13, each are of a p-conduction type (positive type). It was found that a film prepared by introducing trace amounts of oxygen thereinto during the deposition has its conduction type inverted into an n-type (negative type). FIG. 14 shows temperature characteristics of Seebeck coefficient of an amorphous film prepared by introducing oxygen of about 1-5 wt. % into the $\zeta$-FeSi$_2$ phase having a Si content of 70 at. %, wherein the film is indicated by B'. The portion of FIG. 14 indicated by an arrow wherein the Seebeck coefficient is inverted at a temperature near 300°-400° K. is enlargedly shown below the arrow for clarification.

As seen from FIG. 14, the amorphous film of $\zeta$-FeSi$_2$ phase, when trace amounts of oxygen is introduced thereinto, has its conduction type from a p-type to an n-type at a temperature of about 400° K. Also, the amorphous film starts to suddenly increase in Seebeck coefficient at a temperature of about 450° K. and has a large Seebeck coefficient of about $-20$ mV/deg at about 580° K. A reason why a conduction type of the amorphous film was inverted although it has a composition similar to the p-type $\zeta$-FeSi$_2$ amorphous film having a Si content of 72 at. % appears to be due to that the introduction of oxygen causes a direct bond between Fe and Si to be decreased and the formation of Fe—O—Si bond through oxygen ion or the formation of Fe—O and Si—O bonds to be increased, to thereby increase in its donor concentration.

Figure 15:
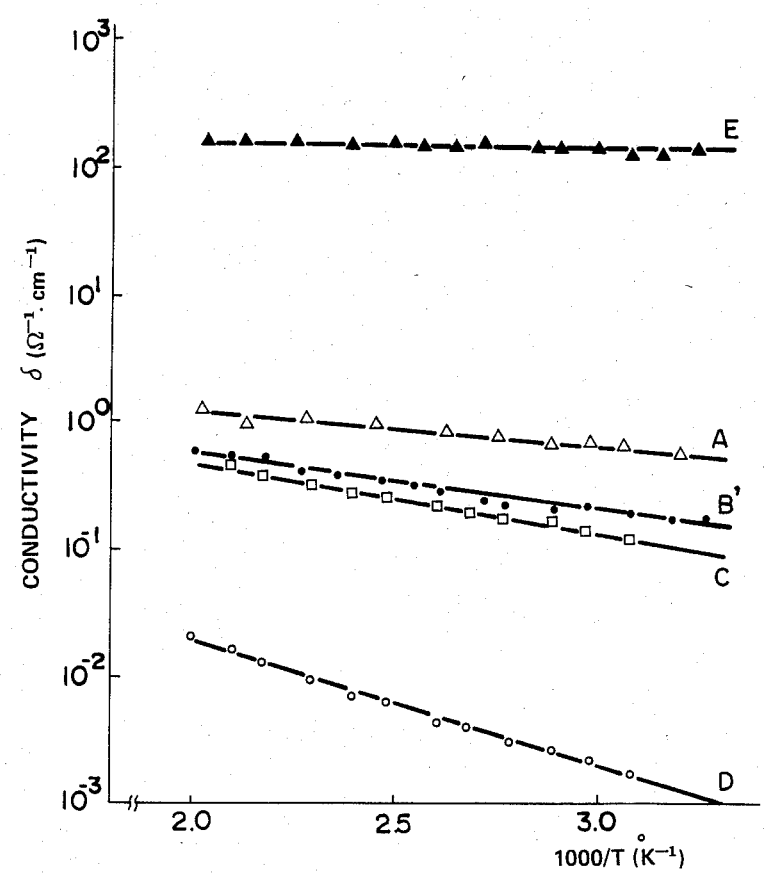
FIG. 15 is a graphical representation showing temperature characteristics of electrical conductivity of a transition element-silicon amorphous film.

Now, referring to FIG. 15 showing temperature characteristics of electrical conductivity measured on each of the amorphous films prepared in the manners mentioned above, reference characters A, C, D and E respectively indicate the p-type amorphous films in which composition ratios of Si to Fe are 68 at. %, 80 at. %, 83 at. % and 50 at. %, and B' indicating the amorphous film which has a Si content of 70 at. % and has its conduction type inverted into an n-type by introducing oxygen thereinto. As seen from FIG. 15, the amorphous film E of $\epsilon$-FeSi having a Si content of 50 at. % has a conductivity of about $10^2\Omega^{-1}$cm$^{-1}$ at a room temperature, and its temperature characteristics show that the film exhibits a metallic behavior rather than a semiconductor behavior. On the contrary, the p-type amorphous films A, C and D respectively having Si/Fe composition ratios of 68 at. %, 80 at. % and 83 at. % and the amorphous film B' having a Si/Fe composition ratio of 70 at. % and having its conduction type inverted into an n-type exhibit a semiconductor behavior. Also, these amorphous films have a small conductivity as compared with the $\epsilon$-FeSi amorphous film of metallic properties. More particularly, the film A having a Si/Fe composition ratio of 68 at. % has a conductivity of about $1\Omega^{-1}$cm$^{-1}$ at a temperature of 500° K., the n-type film B' having a Si content of 70 at. % and a film having 72 at. % of Si contained in a $\zeta$-FeSi$_2$ phase (not shown) have a conductivity of about $0.8\Omega^{-1}$cm$^{-1,}$ a conductivity of the film C having a Si content of 80 at. % is about 0.7 at. %, and a conductivity of the film D having a Si content of 83 at. % is about $0.02\Omega^{-1}$cm$^{-1}$. Thus, it will be readily noted that a Si content in excess of that of $\zeta$-FeSi$_2$ solid solution causes a conductivity of the film to be suddenly decreased.

Thus, it is noted from the foregoing that the amorphous film formed of $\epsilon$-FeSi phase has metallic properties, whereas the amorphous film having a composition of or similar to $\zeta$-FeSi$_2$ phase exhibits a semiconductor behavior. In order to quantitatively clarify the fact or clear up conduction mechanism of these amorphous films, it is required to obtain information on a bonding manner of the constituent atoms, the closest atomic distance and the like. However, the qualitative reason appears to be that the amorphous film of $\epsilon$-FeSi phase having a coodination of a cubic system within a range of short-distance order has a metallic bond formed therein due to dominant 3d-electron bonding between Fe atoms, whereas the amorphous film of $\zeta$-FeSi$_2$ phase exhibits a semiconductor behavior due to the fact that its crystal structure is a tetragonal system within a range of short-distance order.

Consideration was made on the fact that the p-type amorphous film of $\zeta$-FeSi$_2$ having a Si content of 72 at. % (see FIG. 13) and the n-type amorphous film of $\zeta$-FeSi$_2$ having oxygen incorporated thereinto (see FIG. 14) generate a large thermoelectromotive force. A temperature at which these films generate such high thermoelectromotive force is relatively high or 500°–600° K. Thus, it appears that this is due to the interaction with a carrier by the excitation of a magnon wave (quantized spin wave of a static magnetic mode). More particularly, the amorphous film of the present example prepared according to the CIBD method has a good flat surface, little lattice defect and a uniform composition because of a migration effect peculiar to the CIBD method. Thus, the amorphous film meets a requirement for allowing a magnon wave of a high amplitude to be readily excited, so that the interaction with a carrier may remarkably appear.

Figure 16:
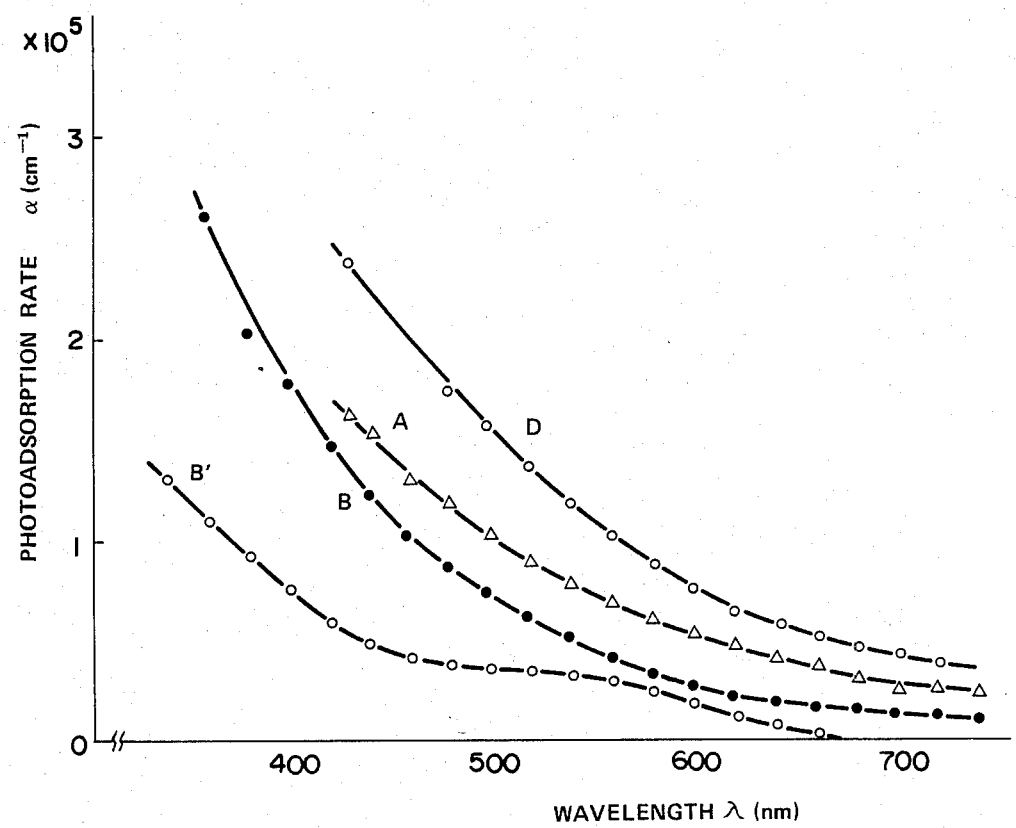
FIG. 16 is a graphical representation showing an optical absorption spectrum of a transition element-silicon amorphous film.

FIG. 16 shows optical absorption spectrum characteristics measured on the amorphous film having a composition approximately $\zeta$-FeSi$_2$ phase, wherein the abscissa axis indicates a wavelength $\lambda$(mm) and the ordinate axis indicates an absorptivity $\alpha$(cm$^{-1}$), and reference characters, A, B and D designate the p-type amorphous films in which composition ratios of Si to Fe are 68 at. %, 72 at. % and 83 at. %, respectively, and B' indicates the amorphous film having a Si/Fe composition ratio of 70 at. % and having its conduction type inverted into an n-type by incorporating oxygen thereinto. Each of these amorphous films had a thickness of 0.2–0.4 $\mu$m. The film B' having oxygen incorporated thereinto was light-brown and the films A, B and D were black-brown. Also, it was observed that the n-type amorphous film B' has a low absorptivity as compared with the other films. The film B' is transparent and has an absorption peak in a wave range between 550 nm and 580 nm which appears to be caused due to the transition of iron ion from $Fe^{3+}$ to $Fe^{2+}$, thus, it will be noted that the film B' has an absorption spectrum considerably different from the other p-type amorphous films. Furthermore, FIG. 16 clearly indicates that the film B of $\zeta$-FeSi$_2$ having a Si content of 72 at. % has the highest transparency in all the amorphous films which do not have oxygen introduced thereinto and is decreased in transparency when its Si or Fe content is in excess of the composition range.

Figure 17:
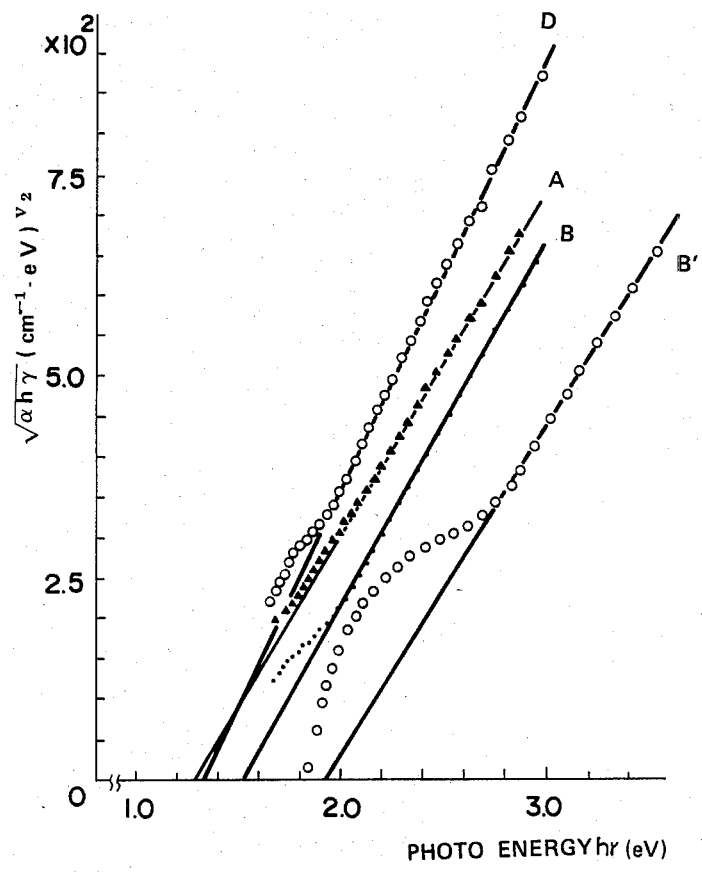
FIG. 17 is a graphical representation showing a correlation between optical absorptivity and photon energy in a transition element-silicon amorphous film.
Figure 18:
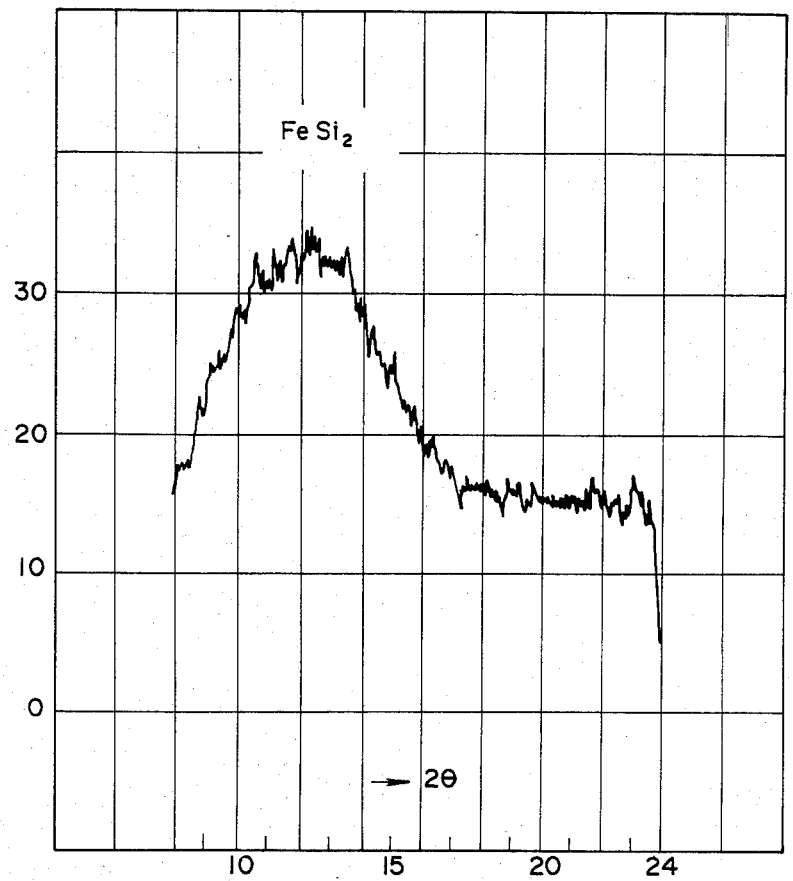
FIG. 18 is an X-ray diffraction pattern showing that a transition element-silicon compound is amorphous.

A correlation between $(\alpha h \nu)^{\frac{1}{2}}$ of these amorphous films and photon energy $h\nu$ which was sought in order to obtain information in the vicinity of an optical absorption edge is shown in FIG. 17. An optical band gap Ego of each of the films obtained on the basis of the information that the intersection between an extension of the linear portion of each film in a high energy region and the abscissa axis in FIG. 17 corresponds to an optical basic absorption edge of the film is shown in the following table.

| Specimen | Si Content (at. %) | Ego (eV) | Ea (eV) | Film Thickness (Å) |
|---|---|---|---|---|
| A | 68 | 1.258 | 0.173 | 3800 |
| B' | 70 | 1.920 | 0.124 | 2000 |
| B | 72 | 1.528 | 0.225 | 2200 |
| C | 80 | — | 0.096 | 5400 |
| D | 83 | 1.311 | 0.203 | 2600 |

As seen from the above results, the n-type film B' of $\zeta$-FeSi$_2$ phase having oxygen introduced thereinto has the largest optical band gap Ego of about 1.92 eV (wave length: 0.65 $\mu$m) and has an optical absorption edge in a visible range. The p-type film B of $\zeta$-FeSi$_2$ has an optical band gap Ego of about 1.53 eV (wavelength: about 0.81 $\mu$m) which is the second largest value. When a Fe and Si content is in excess of the composition range, the optical band gap Ego is decreased to about 1.3 eV (wavelength: about 0.95 $\mu$m). This Ego value is substantially equal to the Ego of Si. In the above table, an activation energy Ea of each film is also shown for reference which was sought on the basis of the above characteristics of each film. As clear from the table, the amorphous film B' having oxygen introduced thereinto has a donor level or donor activation energy Ea of about 0.124 eV and the amorphous films A, B and D have an acceptor level in a range of 0.17–0.23 eV. An activation energy of these films is in excess of at least ten times the typical impurity level in Si (Ea: about 0.026 eV). Thus, it will be noted that the $\zeta$-FeSi$_2$ amorphous film has an impurity of a considerably deep energy level located therein.

A semiconductor containing a 3d-transition element such as Fe, Co, Cr, Mn, Ni, Ti or the like includes, other than silicide such as the Fe-Si compound mentioned above, oxide which appears to be an ionic crystal, halide, carbide which appears to be an interstitial type, sulfide and the like. It appears that crystallographic properties and physical properties of these materials have a close relation to the position and type of an electronegative element included therein, their crystal structure and the like. A significant difference between such semiconductor and a conventional semiconductor which does not contain a 3d-transition element is that the former semiconductor has various excellent electric conductivity and thermoelectric properties such as a Seebeck coefficient, a thermal conductivity and the like due to magnetic moment of a metallic element and often exhibits specific phenomena which cannot be solved according to a conventional simple semiconductor theory.

The example described hereinbefore relates to a silicide containing Fe as a transition element. However, it is a matter of course that the amorphous film includes, in addition to Fe, a substitutional silicide with another transition element such as, for example, $Fe_{1-x}Co_xSi$. Also, according to the present invention, an amorphous film formed of silicide containing a 3d-transition element other than Fe and having the same tetragonal system as the $\zeta$-FeSi$_2$ amorphous film can be prepared which has substantially the same characteristics as the $\zeta$-FeSi$_2$ film.

As can be seen from the foregoing, the energy conversion element of the present invention comprises the thermoelectric material having a thermoelectric effect and the photoelectric material having a photoelectric effect which are joined together; thus, the present invention allows a long wavelength component of solar energy incident on the junction between the both materials to be converted into heat to cause a temperature gradient to be generated across the thermoelectric material, so that a donor ion or an acceptor ion generated due to the flow of a carrier corresponding to the temperature gradient may act as an attracting potential field with respect to electrons or positive holes generated in the photoelectric material by a short wavelength of solar energy to thereby greatly and significantly increase an energy conversion efficiency.

Furthermore, when the amorphous film of a transition element-silicon compound is used as the thermoelectric material, the present invention has another advantage of being proof against a high temperature and having a large thermoelectromotive force (Seebeck coefficient) and a large electrical conductivity.

Obviously many modifications and variations of the present invention are possible in light of the above teachings. It is therefore to be understood that within the scope of the appended claims the invention may be practiced otherwise than as specifically described.

What is claimed as new and desired to be secured by Letters Patent of the United States is:

1. An energy conversion element comprising a thermoelectric material having a thermoelectric effect and a photoelectric material having a photoelectric effect which materials are different in kind from each other and which are directly contacting each other, wherein a positively ionized donor or a negatively ionized acceptor generated due to the flow of a carrier corresponding to a temperature gradient across the thermoelectric material forms an acceleration electrical field with respect to electrons or positive holes generated in the photoelectric material at the junction between said thermoelectric and photoelectric materials.

2. An energy conversion element as defined in claim 1, wherein said thermoelectric material mainly consists of a compound between a transition element X and silicon Si, said compound having a molecular formula of $XSi_2$ and being amorphous.

3. An energy conversion element as defined in claim 2, wherein said transition element X mainly consists of iron, of which at least a part is replaced with at least one of the other 3-transition elements.

4. An energy conversion element as defined in claim 2, wherein said transition element X is at least one element selected from the group consisting of iron, cobalt, chromium, manganese, nickel and titanium.

5. An energy conversion element as defined in claim 1, wherein said thermoelectric material mainly consists of a compound between a transition element X and silicon Si; said compound having a molecular formula of $XSi_2$, having trace amounts of at least one impurity element added thereto which is selected from the group consisting of oxygen, nitrogen, carbon and the like, and being amorphous.

6. An energy conversion element as defined in claim 5, wherein said transition element X is at least one element selected from the group consisting of iron, cobalt, chromium, manganese, nickel and titanium.

7. An energy conversion element as defined in claim 5, wherein said transition element X mainly consists of iron, of which at least a part is replaced with at least one of the other 3d-transition elements.

8. An energy conversion element as defined in claim 1, further comprising:
said photoelectric and thermoelectric materials formed as at least partially abutting layer pairs;
plural of said layer pairs connected in series.

9. An energy conversion element as defined in claim 8, further comprising:
means for focusing solar energy on at least one of said layer pairs.

10. An energy conversion element as defined in claim 9, wherein said focusing means comprises:
a Fresnel lens located above said at least one of said layer pairs.

11. An energy conversion element as defined in claim 10, further comprising:
a reflection member thermally establishing in relation to said photoelectric and thermoelectric materials a high temperature area and a low temperature area.

12. An energy conversion element as defined in claim 1, further comprising:
means for focusing solar energy on said photoelectric and said thermoelectric materials.

13. An energy conversion element as defined in claim 12, wherein said focusing means comprises:
a Fresnel lens located above said photoelectric and said thermoelectric materials.

14. An energy conversion element as defined in claim 1, further comprising:
a reflection member thermally establishing in relation to said photoelectric and said thermoelectric materials a high temperature area and a low temperature area.

15. An energy conversion element comprising two kinds of thermoelectric materials capable of carrying out a thermoelectric conversion due to a Seebeck effect and a photoelectric material having a photoelectric effect which is positioned between said two kinds of thermoelectric materials with one surface of said photoelectric material directly contacting one of said two kinds of thermoelectric materials and with another surface of said photoelectric material directly contacting the other of said two kinds of thermoelectric materials, wherein a positively ionized donor and a negatively ionized acceptor generated due to the flow of carriers corresponding to temperature gradients generated across said two thermoelectric materials respectively form acceleration electrical fields with respect to electrons and positive holes generated in said photoelectric material.

16. An energy conversion element as defined in claim 15, wherein at least one of said thermoelectric materials mainly consists of a compound between a transition element X and silicon Si; said compound having a molecular formula of $XSi_2$ and being amorphous.

17. An energy conversion element as defined in claim 16, wherein said transition element X mainly consists of iron, of which at least a part is replaced with at least one of the other 3d-transition elements.

18. An energy conversion element as defined in claim 16, wherein said transition element X is at least one element selected from the group consisting of iron, cobalt, chromium, nickel and titanium.

19. An energy conversion element as defined in claim 15, wherein at least one of said thermoelectric materials mainly consists of a compound between a transition element X and silicon Si; said compound having a molecular formula of $XSi_2$, having trace amounts of at least one impurity element added thereto which is selected from the group consisting of oxygen, nitrogen, carbon and the like, and being amorphous.

20. An energy conversion element as defined in claim 19, wherein said transition element X is at least one element selected from the group consisting of iron, cobalt, chromium, manganese, nickel and titanium.

21. An energy conversion element as defined in claim 19, wherein said transition element X mainly consists of iron, of which at least a part is replaced with at least one of the other 3d-transition elements.

22. An energy conversion element as defined in claim 15, wherein said two kinds of thermoelectric materials and said photoelectric material are deposited in laminated relationships on a substrate; at least the thermoelectric material deposited on an upper position being light-permeable.

23. An energy conversion element as defined in claim 15, further comprising:
   said two kinds of thermoelectric materials and said photoelectric material formed as at least partially abutting layer triplets; and
   plural of said layer triplets connected in series.

24. An energy conversion element as defined in claim 23, further comprising:
   means for focusing solar energy on at least one of said layer triplets.

25. An energy conversion element as defined in claim 24, wherein said focusing means comprises:
   a Fresnel lens located above said at least one of said layer triplets.

26. An energy conversion element as defined in claim 25, further comprising:
   a reflection member thermally establishing in relation to said photoelectric and said thermoelectric materials a high temperature area and a low temperature area.

27. An energy conversion element as defined in claim 15, further comprising:
   means for focusing solar energy on said photoelectric and said thermoelectric materials.

28. An energy conversion element as defined in claim 13, wherein said focusing means comprises:
   a Fresnel lens located above said photoelectric and said thermoelectric materials.

29. An energy conversion element as defined in claim 28 further comprising:
   a reflection member thermally establishing in relation to said photoelectric and said thermoelectric materials a high temperature area and a low temperature area.

* * * * *